United States Patent
Zhou et al.

(10) Patent No.: US 9,471,074 B2
(45) Date of Patent: Oct. 18, 2016

(54) USB REGULATOR WITH CURRENT BUFFER TO REDUCE COMPENSATION CAPACITOR SIZE AND PROVIDE FOR WIDE RANGE OF ESR VALUES OF EXTERNAL CAPACITOR

(71) Applicant: Microchip Technology Incorporated, Chandler, AZ (US)

(72) Inventors: Huamin Zhou, Chandler, AZ (US); Woowai Martin, Phoenix, AZ (US); Cristian Albina, Chandler, AZ (US); Fritz Schlunder, Gilbert, AZ (US); Minh Le, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 104 days.

(21) Appl. No.: 14/204,011

(22) Filed: Mar. 11, 2014

(65) Prior Publication Data
US 2014/0266107 A1    Sep. 18, 2014

Related U.S. Application Data

(60) Provisional application No. 61/780,985, filed on Mar. 14, 2013.

(51) Int. Cl.
*G05F 1/575* (2006.01)
*H03F 3/45* (2006.01)

(52) U.S. Cl.
CPC ............ *G05F 1/575* (2013.01); *H03F 3/45192* (2013.01); *H03F 2200/45* (2013.01); *H03F 2203/45192* (2013.01); *H03F 2203/45626* (2013.01)

(58) Field of Classification Search
CPC ............................ G05F 1/575; H03F 3/45192
USPC .......................................................... 323/280
See application file for complete search history.

(56) References Cited

U.S. PATENT DOCUMENTS

| | | | | |
|---|---|---|---|---|
| 6,246,221 B1* | 6/2001 | Xi | ............................ | G05F 1/575 323/280 |
| 7,312,598 B1 | 12/2007 | Huang et al. | .................. | 323/280 |
| 7,656,224 B2* | 2/2010 | Perez | .................... | H03F 1/0261 323/282 |
| 7,683,720 B1* | 3/2010 | Yehui | .................. | H03F 3/45192 30/252 |
| 2002/0171403 A1* | 11/2002 | Lopata | ................ | H03F 3/45183 323/280 |

(Continued)

FOREIGN PATENT DOCUMENTS

| CN | 101419477 A | 4/2009 | ............... | G05F 1/56 |
|---|---|---|---|---|
| CN | 101853040 A | 10/2010 | ............... | G05F 1/56 |
| CN | 102915061 A | 2/2013 | ............... | C05F 1/56 |

OTHER PUBLICATIONS

Al-Shyoukh et al., Aug. 2007, IEEE, JOSSC vol. 42 No. 8, 1732-1742.*

(Continued)

*Primary Examiner* — Jue Zhang
(74) *Attorney, Agent, or Firm* — Slayden Grubert Beard PLLC (57) ABSTRACT

A voltage regulator has a large gm current buffer driver added between a first stage of an operation amplifier and a last stage power transistor. This current buffer allows a significant reduction in the maximum internal and external compensation capacitances needed for regulator stability. The current buffer compensation circuit allows a wide range of external capacitor sizes that increases the flexibility in choosing the external capacitor types (with low to high ESR ratings).

18 Claims, 8 Drawing Sheets

(56) References Cited

U.S. PATENT DOCUMENTS

| | | | |
|---|---|---|---|
| 2005/0168272 A1 | 8/2005 | Banerjee et al. | 327/541 |
| 2006/0192538 A1 | 8/2006 | Wang et al. | 323/282 |
| 2007/0210770 A1* | 9/2007 | Dean | G05F 1/46 323/273 |
| 2009/0009147 A1* | 1/2009 | Jian | G05F 1/575 323/280 |
| 2013/0241505 A1* | 9/2013 | Chang | G05F 1/575 323/282 |

OTHER PUBLICATIONS

International Search Report and Written Opinion, Application No. PCT/US2014/023962, 16 pages, Nov. 3, 2014.

* cited by examiner

(a) Normal frequency response (b) ESR value too high

FIGURE 1
PRIOR ART (d) "Tunnel of death"

(c) ESR value too low

USB REGULATOR WITH CURRENT BUFFER TO REDUCE COMPENSATION CAPACITOR SIZE AND PROVIDE FOR WIDE RANGE OF ESR VALUES OF EXTERNAL CAPACITOR

RELATED PATENT APPLICATION

This application claims priority to commonly owned U.S. Provisional Patent Application Ser. No. 61/780,985; filed Mar. 14, 2013; which is hereby incorporated by reference herein for all purposes.

TECHNICAL FIELD

The present disclosure relates to USB voltage regulators, and, more particularly, to a USB voltage regulator having a current buffer to reduce compensation capacitor size and provide for a wide range of external compensation capacitor ESR values.

BACKGROUND

USB voltage regulators operate with extremely low equivalent series resistance (ESR) values, for example around 10 milliohms. This ESR value is not very accurate because the ceramic capacitor manufacturers rarely specify the value of ESR in their data sheets. Additionally, the exact value depends on the size/voltage rating design of the external capacitor, and can vary based on user connection topology (circuit board layout and components used thereon), e.g., putting multiple small capacitors in parallel, thereby reducing ESR; or using thin/long printed circuit board traces to connect to the capacitor, thereby adding copper trace resistance ESR. Typically the externally compensated low-drop out (LDO) voltage regulator uses large value external capacitors for stability with a limited range of ESR ratings. The ESR values will heavily impact the design of LDO voltage regulators due to its variable zero pole locations depending upon the load conditions. Therefore existing products having a USB interface use standard voltage regulator architectures that require very large external capacitor sizes with variations of ESR values in order to keep the voltage regulator stable.

Figure 1:
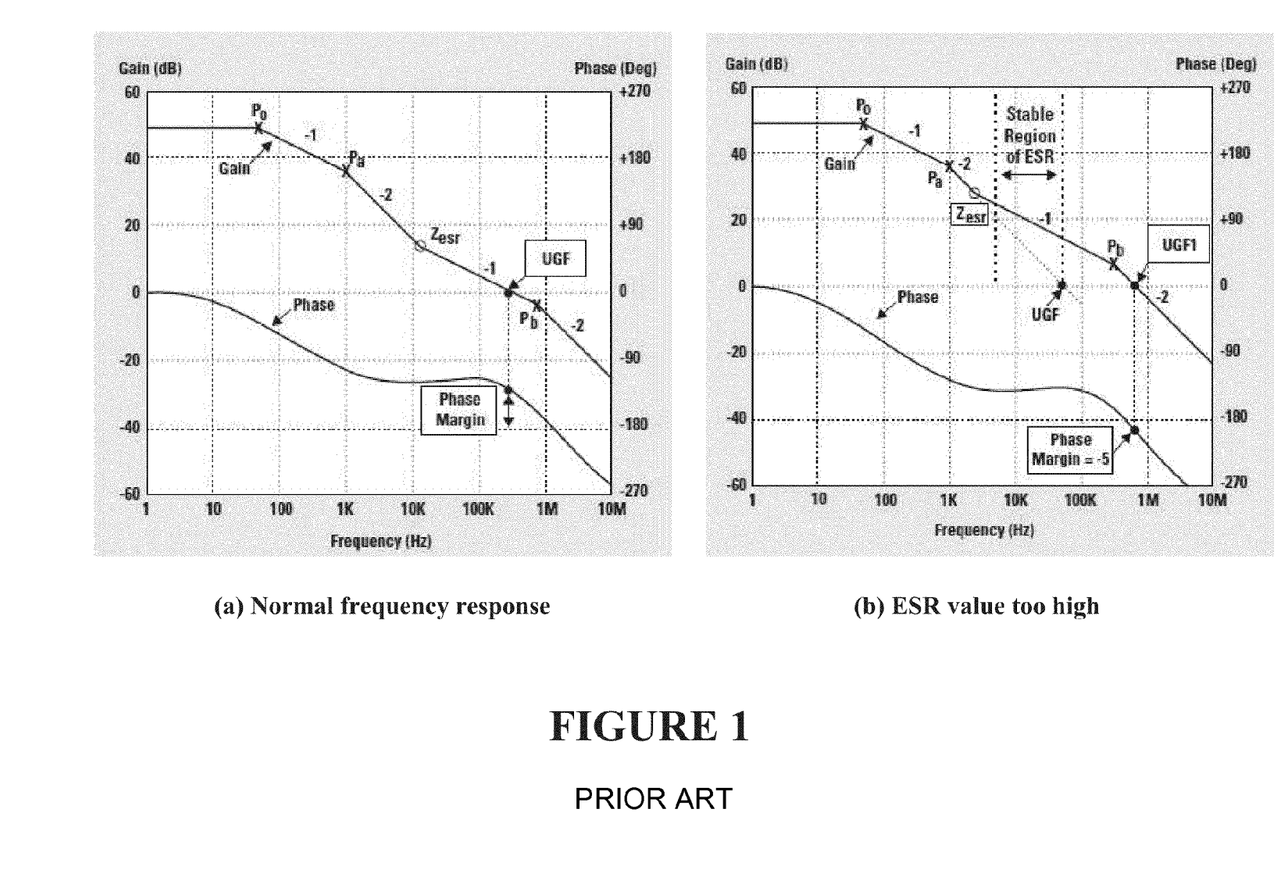
FIGS. 1 and 1A illustrate various frequency response graphs showing different ESR situations.
Figure 1A:
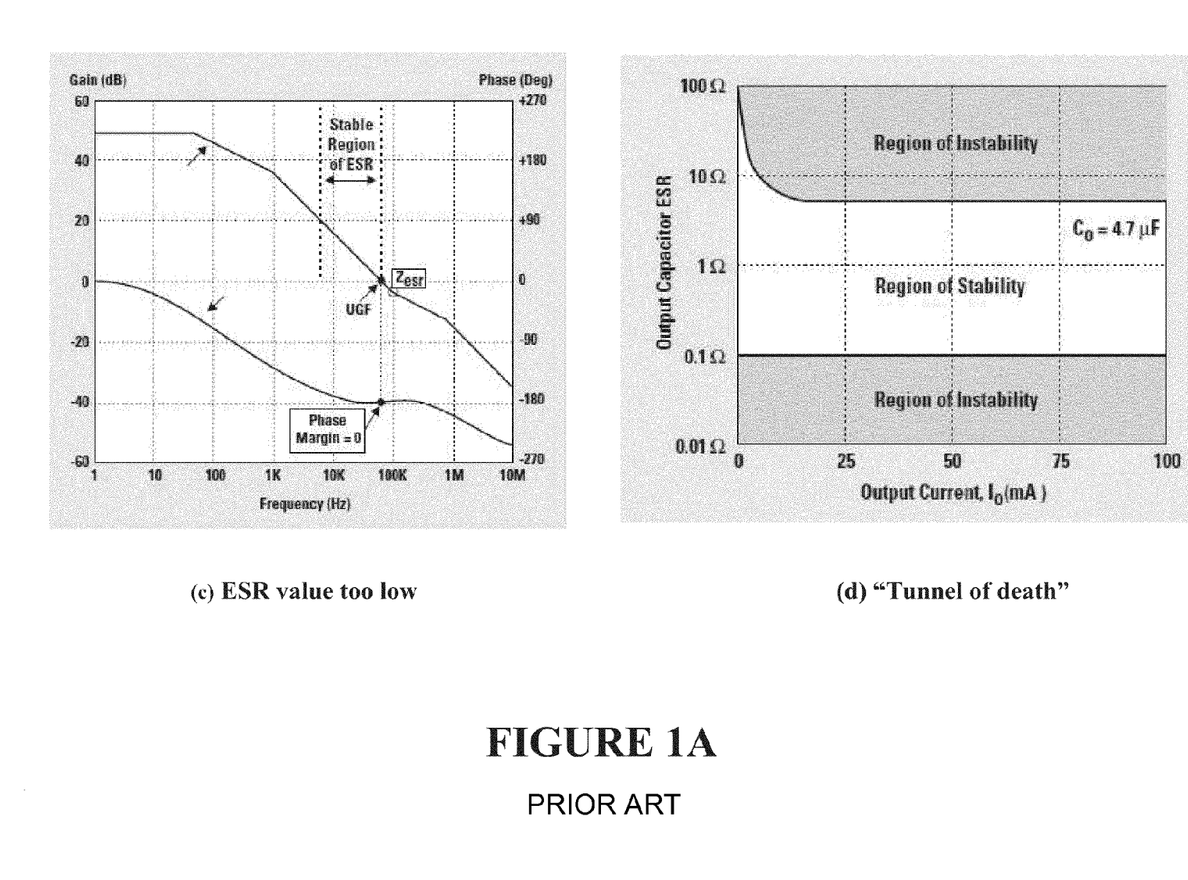

Referring to FIGS. 1 and 1A, depicted are various frequency response graphs showing different ESR situations. FIG. 1(a) shows a desired normal frequency response. FIG. 1(b) shows a situation where the ESR is too high. FIG. 1A(c) shows a situation where the ESR is too low. And FIG. 1A(d) shows ESRs resulting in the dreaded "tunnel of death."

SUMMARY

Therefore a need exists to significantly improve the range of external capacitors with small to large ESR values and reduce the size of the internal compensation capacitance value for stabilizing an associated voltage regulator, especially a low-drop out (LDO) voltage regulator.

According to an embodiment, a voltage regulator may comprise: an operational amplifier; a gm enhanced current buffer driver; an output power driver, wherein the current buffer driver may be coupled between the operational amplifier and the output power driver; a current feedback circuit coupled between the output power driver and the current buffer driver; and a feedback loop coupled between the output power driver and the operational amplifier.

According to a further embodiment, a gm-boost circuit may be coupled to the current buffer driver. According to a further embodiment, the gm-boost circuit increases the current buffer driver input impedance. According to a further embodiment, the gm-boost circuit enables the current buffer driver to have a large gm value. According to a further embodiment, a biasing circuit may be coupled to the current buffer driver to set a biasing ratio for gm-boost of the current buffer driver. According to a further embodiment, an enable/disable function may be provided to enable/disable the biasing circuit for reducing standby current. According to a further embodiment, a compensation capacitor may be coupled between the output power driver and a cascode node of the operational amplifier. According to a further embodiment, the voltage regulator may be a low drop out (LDO) voltage regulator. According to a further embodiment, the operational amplifier may have a first input adapted for coupling to a voltage reference, and a second input coupled to the feedback loop. According to a further embodiment, the operational amplifier may be a low gain and high bandwidth amplifier. According to a further embodiment, the low gain and high bandwidth amplifier may be a folded-cascode amplifier. According to a further embodiment, the operational amplifier may comprise diode connected PMOS transistors for lowering an output impedance of the folded-cascode amplifier. According to a further embodiment, the current buffer driver may be an operational transconductance amplifier (OTA).

According to a further embodiment, the current feedback circuit may sense a current change at the output power driver. According to a further embodiment, the current feedback circuit may provide transient enhancement for improved load regulation. According to a further embodiment, the current feedback circuit may provide a feedback voltage from an output voltage node. According to a further embodiment, the current buffer driver may have a low output impedance. According to a further embodiment, capacitors in the biasing circuit may be provided for improving noise immunity thereof. According to a further embodiment, the voltage regulator may be a USB voltage regulator. According to a further embodiment, the current buffer driver may have low input impedance and may provide a high frequency pole that may not substantially affect the voltage regulator dominant pole.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

In typical low-drop out regulator (LDO) designs, the output load is not always constant. As the load changes, the pole location at the output varies from relatively high frequency (full load, e.g., >30 mA) to very low frequency (no load or very low load, e.g., <100 µA), resulting in difficulty in separating the output pole and the gate pole due to large power PMOS transistor size. A USB regulator has a very large power PMOS transistor as an output driver due to the large transition range in load currents, typically from very low, less than 250 µA to very large at about 60 mA. Due to this unique application, SoC (system on chip) design (capacitor-less architecture) is very hard to achieve. An external capacitor is needed for USB LDO voltage regulator applications. The external capacitor may have very different ESR (equivalent series resistance) values ranging from a few milliohms to tens of ohms causing the output pole-zero locations to shift drastically. Therefore a need exists to push the gate pole of the last stage PMOS power transistor to a higher frequency when using external capacitors in, for example but not limited to, a USB LDO voltage regulator.

According to various embodiments, a voltage regulator may comprise a large gm (transconductance) current driver (low impedance current buffer amplifier) added between a first stage operation amplifier (OpAmp) and a last stage power transistor, e.g., p-channel metal oxide semiconductor (PMOS) transistor. This current buffer allows a significant reduction of the maximum internal compensation capacitance to about 3.7 picofarads, and the working range of the external load capacitance from about 0.4 microfarads to about 4.7 microfarads. In addition, the current buffer, according to the teachings of this disclosure, offers the circuit designer a wider range of external capacitor sizes to choose from. The current buffer compensation circuit described and claimed herein allows reduced external capacitor size that increases the overall circuit board layout efficiency and flexibility of capacitor choices. In addition, according to various embodiments, the voltage regulator, e.g., USB voltage regulator, may consume less power by, for example but is not limited to, using low-drop out (LDO) voltage regulator circuit designs, according to the teachings of this disclosure.

Figure 2:
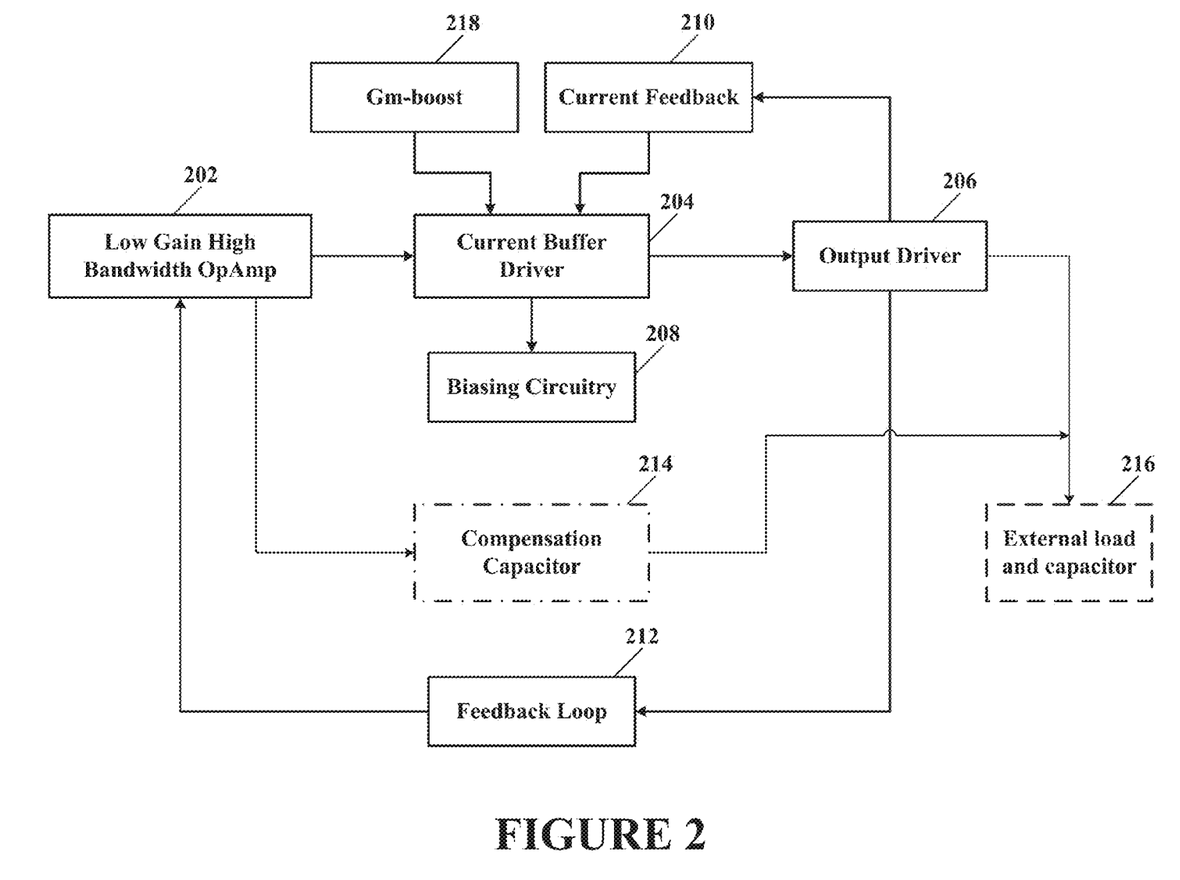
FIG. 2 illustrates a schematic block diagram of a USB voltage regulator, according to a specific example embodiment of this disclosure.

According to various embodiments, various values of ESR may be handled by separating the poles inside of the voltage regulator circuit sufficiently to create an approximate one pole system. Referring to FIG. 2, depicted is a schematic block diagram of a voltage regulator, according to a specific example embodiment of this disclosure. The regulator may comprise a low-gain operational amplifier (OpAmp) 202, a low-impedance current buffer driver 204, and a power output driver 206, e.g., PMOS. The key to being able to use smaller value internal and external capacitances is to have a large gm current driver buffer amplifier 204 between the first stage OpAmp 202 and the last stage power output driver 206. The voltage regulator of FIG. 2 may further comprise biasing circuits 208, current feedback 210, a feedback loop 212, a compensation capacitor 214 and a gm-boost circuit 218. This voltage regulator may supply power (voltage and current) to an external load and capacitor 216 and may further be used as a USB voltage regulator.

The implementation of the OpAmp 202 as a folded-cascode configuration is due to its unique architecture which results in a single pole at the output that minimizes the complexity of its compensation. The current buffer driver 204 acts like a low impedance driver which connects between the OpAmp 202 and the output driver 206. Since the output driver 206 may provide very large amounts of switching current during power supply operation, the gate capacitance is significantly high due to the size of the driver, thereby resulting in the generation of a pole at relatively low frequency. Thus the current buffer driver 204 pushes this pole to a high frequency beyond unity-gain frequency due to its low-impedance characteristics in order to get the pole-splitting effect. To achieve this, it is necessary to provide a fairly large gm value of the current buffer driver 204. The gm-boost circuit 218 may provide a gm-boost technique that will increase the impedance value of the current buffer driver 204 with the help of the current feedback 210 which may sense the current change at the output of the output driver 206. The current feedback 210 also may behave like a transient enhancement circuit which will help with load regulation of the regulator during, for example but is not limited to, USB power supply operation.

Figure 3:
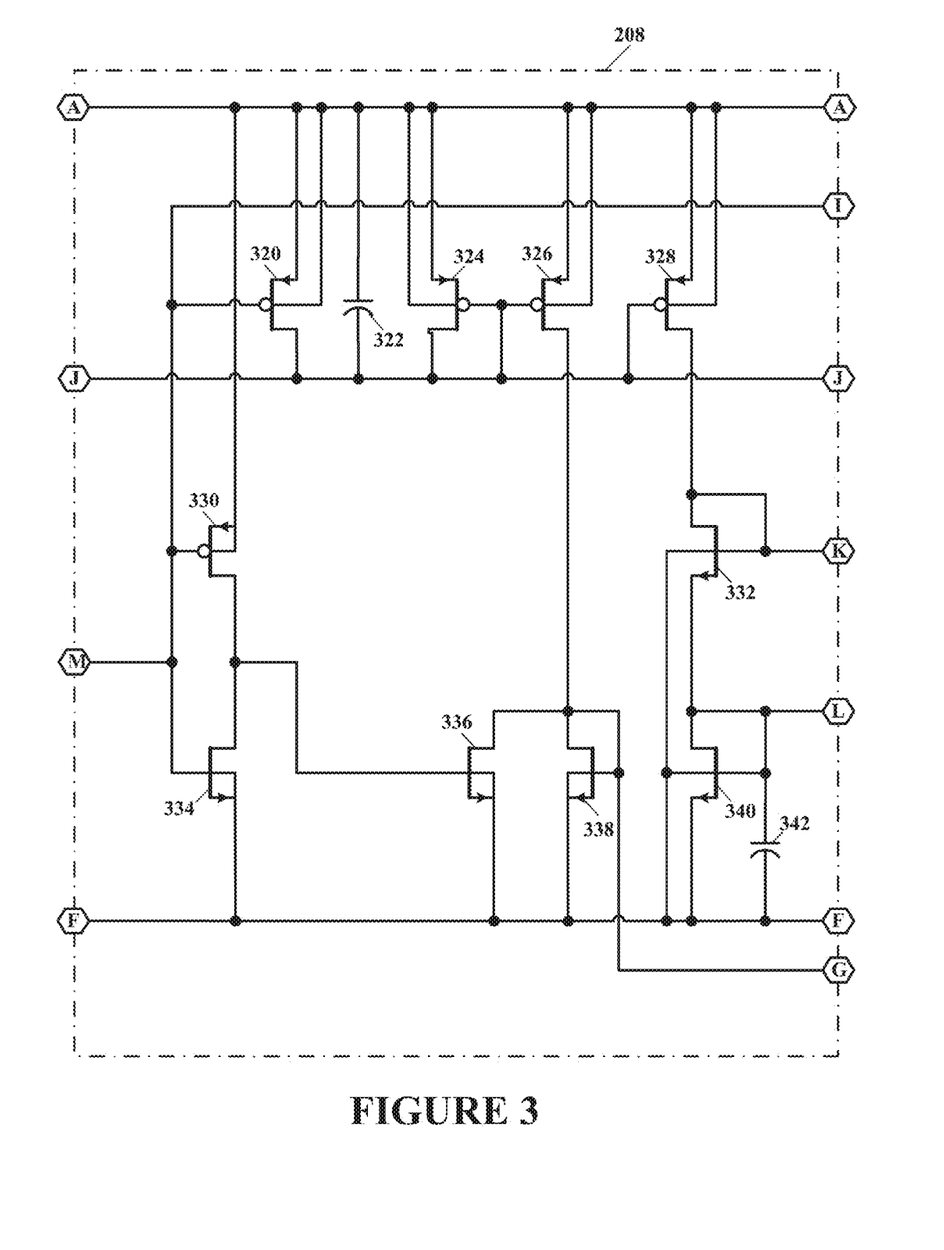
FIGS. 3, 3A and 3B illustrate in combination a schematic diagram of a folded-cascode amplifier having bias, gm-boost, current driver and current feedback circuits, according to a specific embodiment of this disclosure.
Figure 3A:
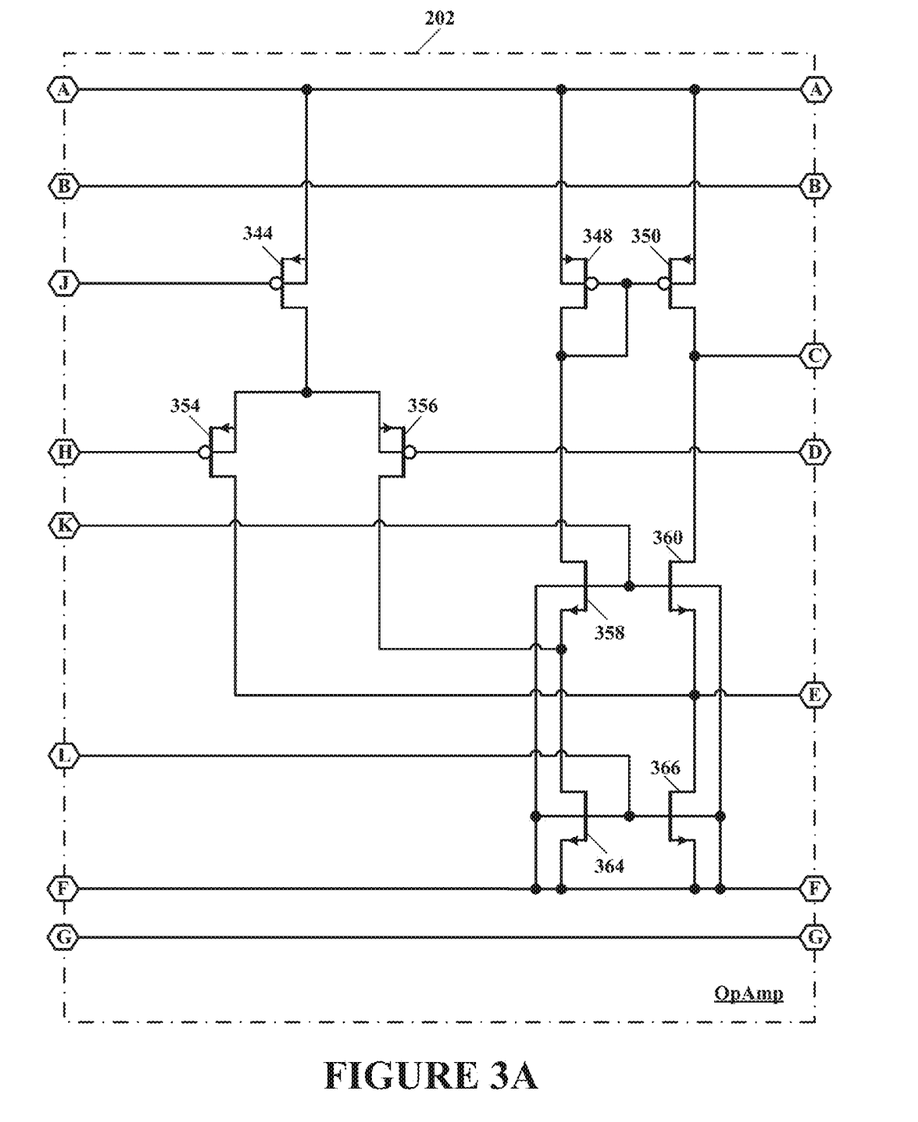
Figure 3B:
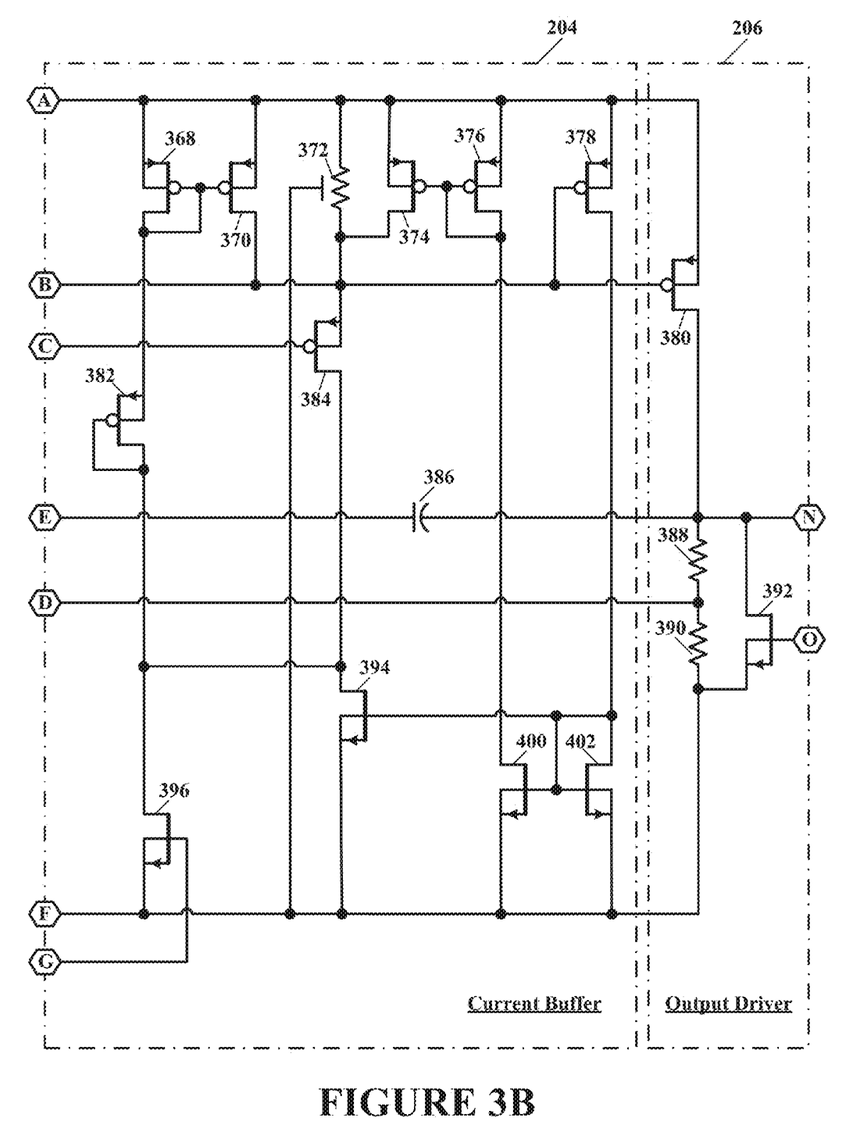

The input stage OpAmp 202 may be a low-gain, high-bandwidth amplifier comprising diode connected PMOS transistors that lower the output impedance of the folded-cascode amplifier. Referring to FIGS. 3, 3A and 3B, depicted in combination is a schematic diagram of a folded-cascode amplifier having gm-boost, current driver and current feedback circuits, according to a specific embodiment of this disclosure. A folded-cascode amplifier design was selected for the input stage OpAmp 202 for the following reasons: (1) The architecture forms only one pole at the output of the folded stage which reduces the complexity of frequency compensation, (2) it provides a good driving capability for the source follower stage of the current buffer 204 shown in FIG. 3B placed thereafter due to its characteristics of being an OTA (Operational Transconductance Amplifier) that may be adapted to drive a capacitive load such as the gate of transistor 384, and (3) its uniqueness of the folded stage (transistors 360 and 366 shown in FIG. 3A) may be used as an indirect compensation node E.

Shown in FIG. 3 is the bias circuit 208 for the USB regulator. Transistors 320, 330, 334 and 336 may be shut off during disabling/power down operation to make sure this circuit will consume substantially no DC current. Capacitors 322 and 342 are coupling capacitors to improve the VDD noise cancelation making sure the gates of transistors 324, 326 and 328 are moving the same way as VDD (node A) to cancel the power noise resulting with Vsg_noise=0.342 acts similarly to help transistor 340 have better ground noise immunity resulting in Vgs_noise=0. Node M is the enable signal coming to the regulator circuit so that the module can be turned off when disabled.

The output stage (transistors 350, 360 and 366) from the OpAmp 202 (FIG. 3A, node C) then connects to the gate of the PMOS second stage transistor 384. The low impedance looking into the amplifier function of the current buffer 204 and source of transistor 384 creates a fairly high frequency pole that would be irrelevant to interact with the system dominant pole, which connects to the power PMOS transistor 380 in the power output driver 206, thereby having more efficient pole-splitting, and allowing easier frequency compensation. The current driver stage transistor 384 (in the current buffer 204) of the regulator circuit shown in FIG. 3B creates a low impedance environment using the current buffer (transistors 384 and 394, and resistor 372) to separate the poles seen on the big power output driver 206 comprising transistor 380 and the internal stages of the regulator (OpAmp 202, FIG. 3A, node C). By literally pushing the pole at the gate of transistor 380 to a high frequency domain, effectively leaves the only dominant pole at the output (node C) of the OpAmp 202 during full-load conditions. To achieve such operation, a gm-boost stage may be used.

The gm-boost stage 218 may comprise transistors 368, 370, 374, 376, 378, 382, 396, 394, 400, 402, 384 and resistor 372 shown in FIG. 3B of the current buffer 204. The current driver may comprise transistors 370, 384 and 394, and resistor 372 shown in FIG. 3B of the current buffer 204, and the current feedback circuits 210 may comprise transistors 374, 376, 378, 400, 402, and 394 shown in FIG. 3B of the current buffer 204. The gm of the PMOS current buffer driver 204 may comprise transistor 384 and may be coupled to two sources of currents, one from the bias network and the other as current feedback 210 comprising transistors 378, 400, 402 and 376 from the power output stage 206 that may comprise transistor 380. The bias network may be fixed by transistor 396. Then these currents are ratio'ed in transistors 368 and 370 to provide a sufficient amount of current for the driver transistor 384 but not enough to increase more current based upon a limited current mirror by transistor 396.

The feedback network 212 may comprise transistor 380, the resistors 388 and 390 may be coupled to the output transistor 380, and may actively provide current to the current driver transistor 384 when the regulation circuit experiences different output load conditions. This feedback network 212 provides feedback voltage to one differential input (transistor 356, FIG. 3A, node D) of the OpAmp 202 to compare with a reference voltage (from a voltage reference not shown) connected to the other differential input (transistor 354, FIG. 3A, node H). The only compensation capacitor required between the output stage of the OpAmp 202 node C in FIG. 3A and the output stage of the regulator above resistor 388 coupled to output node N in FIG. 3B need only be sized to make sure that the poles are even further well separated. This value is limited to a small number which helps in stabilizing the regulator system. With the simple current buffer 204 comprising transistors 368, 370, 374, 376, 378, 382, 396, 394, 400, 402, 384 and resistor 372, the voltage regulator acts like a pseudo "one-pole" system that is independent from the output pole changing so long as it falls within the bandwidth of the system. Thus, the range of ESR is extended along with the output capacitance. Therefore a wider range of external capacitors may be effectively used, according to the teachings of this disclosure.

Figure 4:
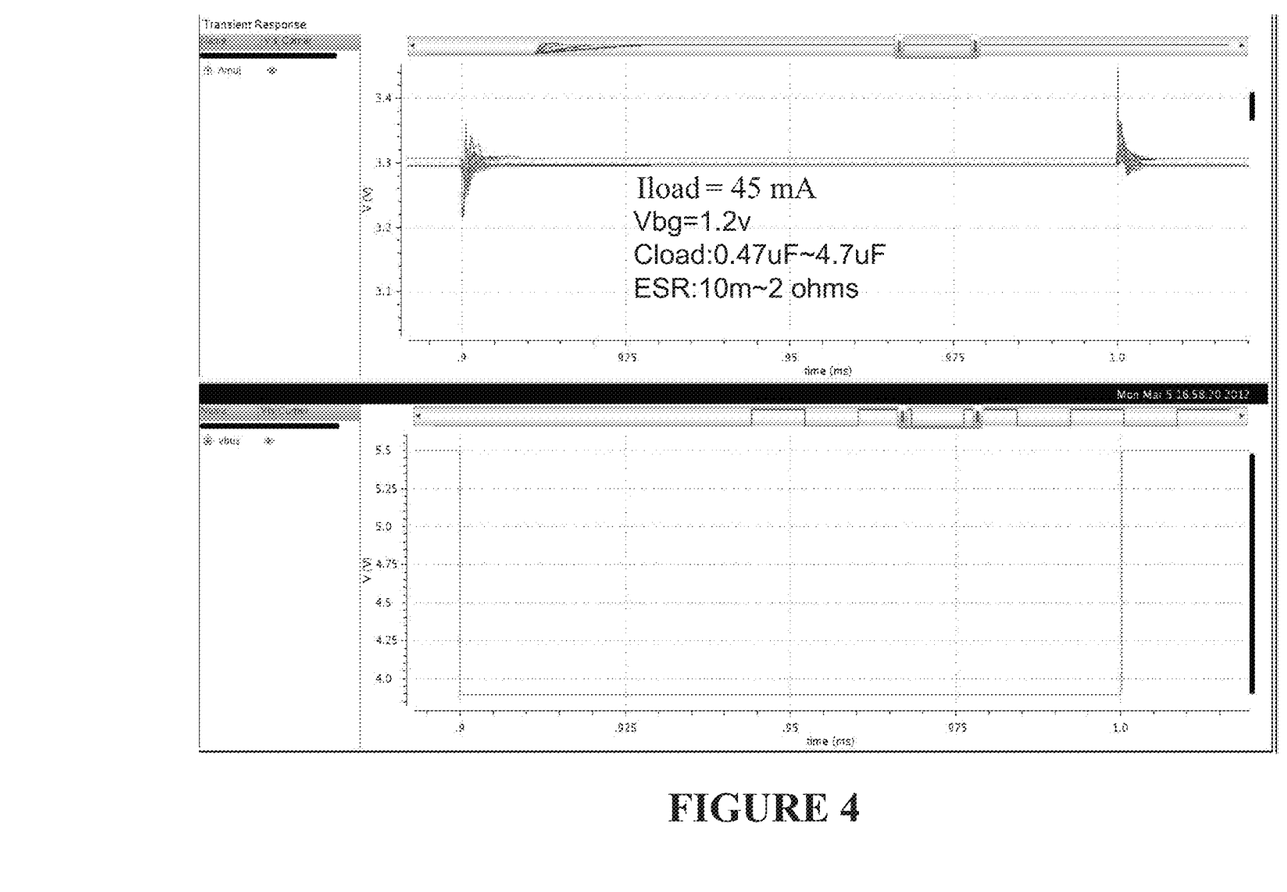
FIGS. 4 and 5 illustrate transient and regulation response curves, according to the teachings of this disclosure.
Figure 5:
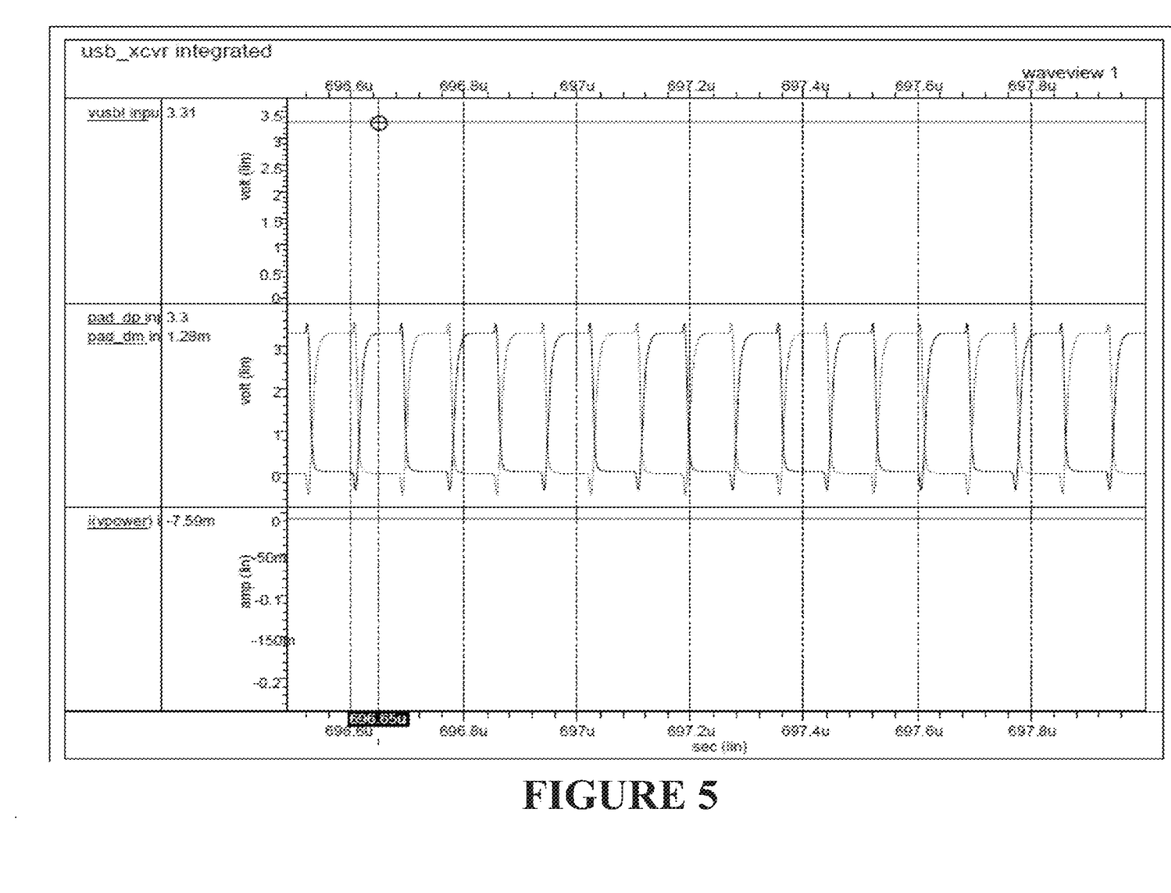

Referring to FIGS. 4 and 5, depicted are transient and regulation response curves, according to the teachings of this disclosure. Shown are line transient response graphs reflecting the AC response of the system wherein the regulator output is stable with supply voltage change in transient. These graphs show the regulator system using a small compensation capacitor is stable.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A voltage regulator, comprising:
an operational amplifier;
a gm enhanced current buffer driver;
a biasing circuit coupled to the current buffer driver to set a biasing ratio for gm-boost of the current buffer driver;
an enable/disable function to enable/disable the biasing circuit for reducing standby current:
an output power driver, wherein the current buffer driver is coupled between the operational amplifier and the output power driver;
a current feedback circuit coupled between the output power driver and the current buffer driver; and
a feedback loop coupled between the output power driver and the operational amplifier.

2. The voltage regulator according to claim 1, further comprising a gm-boost circuit coupled to the current buffer driver.

3. The voltage regulator according to claim 2, wherein the gm-boost circuit increases the current buffer driver input impedance.

4. The voltage regulator according to claim 2, wherein the gm-boost circuit enables the current buffer driver to have a large gm value.

5. The voltage regulator according to claim 1, further comprising a compensation capacitor coupled between the output power driver and a cascode node of the operational amplifier.

6. The voltage regulator according to claim 1, wherein the voltage regulator is a low drop out (LDO) voltage regulator.

7. The voltage regulator according to claim 1, wherein the operational amplifier has a first input adapted for coupling to a voltage reference, and a second input coupled to the feedback loop.

8. The voltage regulator according to claim 1, wherein the operational amplifier is a low gain and high bandwidth amplifier.

9. The voltage regulator according to claim 8, wherein the low gain and high bandwidth amplifier is a folded-cascode amplifier.

10. The voltage regulator according to claim 9, wherein the operational amplifier comprises diode connected PMOS transistors for lowering an output impedance of the folded-cascode amplifier.

11. The voltage regulator according to claim 1, wherein the current buffer driver is an operational transconductance amplifier (OTA).

12. The voltage regulator according to claim 1, wherein the current feedback circuit senses a current change at the output power driver.

13. The voltage regulator according to claim 1, wherein the current feedback circuit provides transient enhancement for improved load regulation.

14. The voltage regulator according to claim 1, wherein the current feedback circuit provides a feedback voltage from an output voltage node.

15. The voltage regulator according to claim 1, wherein the current buffer driver has a low output impedance.

16. The voltage regulator according to claim 1, further comprising capacitors in the biasing circuit for improving noise immunity thereof.

17. The voltage regulator according to claim 1, wherein the voltage regulator is a USB voltage regulator.

18. The voltage regulator according to claim 1, wherein the current buffer driver has low input impedance and provides a high frequency pole that does not substantially affect the voltage regulator dominant pole.

* * * * *